United States Patent
Kim

(10) Patent No.: US 6,943,092 B2
(45) Date of Patent: Sep. 13, 2005

(54) METHODS OF MANUFACTURING SEMICONDUCTOR DEVICES

(75) Inventor: In-Su Kim, Suwon-Si (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 10/729,227

(22) Filed: Dec. 5, 2003

(65) Prior Publication Data

US 2004/0126991 A1 Jul. 1, 2004

(30) Foreign Application Priority Data

Dec. 28, 2002 (KR) .................... 10-2002-0085921

(51) Int. Cl.[7] .................................................. H01L 21/76
(52) U.S. Cl. .................... 438/424; 438/435; 438/437; 438/700; 438/735; 438/736; 438/739; 438/743; 438/744; 438/757; 438/787
(58) Field of Search .................... 438/424, 435, 438/437, 700, 717, 719, 724, 735–739, 743–744, 757, 787

(56) References Cited

U.S. PATENT DOCUMENTS

| | | | | | |
|---|---|---|---|---|---|
| 5,578,518 | A | * | 11/1996 | Koike et al. ................ | 438/424 |
| 5,712,185 | A | * | 1/1998 | Tsai et al. ................... | 438/424 |
| 5,766,823 | A | * | 6/1998 | Fumitomo .................. | 430/314 |
| 5,868,870 | A | | 2/1999 | Fazan et al. ................ | 148/33.3 |
| 5,910,018 | A | * | 6/1999 | Jang ........................... | 438/425 |
| 5,940,716 | A | * | 8/1999 | Jin et al. ..................... | 438/424 |
| 6,010,947 | A | * | 1/2000 | Kondo ........................ | 438/435 |
| 6,027,982 | A | * | 2/2000 | Peidous et al. ............. | 438/424 |
| 6,066,544 | A | * | 5/2000 | Pan et al. .................... | 438/424 |
| 6,080,637 | A | * | 6/2000 | Huang et al. ............... | 438/424 |
| 6,117,748 | A | * | 9/2000 | Lou et al. .................... | 438/400 |
| 6,153,479 | A | * | 11/2000 | Liao et al. .................. | 438/296 |
| 6,165,853 | A | | 12/2000 | Nuttall et al. ............... | 438/296 |
| 6,169,021 | B1 | * | 1/2001 | Akram et al. ............... | 438/612 |
| 6,191,004 | B1 | * | 2/2001 | Hsiao ......................... | 438/435 |
| 6,214,698 | B1 | | 4/2001 | Liaw et al. .................. | 438/435 |
| 6,284,623 | B1 | * | 9/2001 | Zhang et al. ............... | 438/424 |
| 6,313,648 | B1 | * | 11/2001 | Syo ............................. | 324/719 |
| 6,355,538 | B1 | * | 3/2002 | Tseng ......................... | 438/424 |
| 6,372,602 | B1 | * | 4/2002 | Mitsuiki ..................... | 438/424 |
| 6,716,718 | B2 | * | 4/2004 | Nagatani et al. ............ | 438/424 |
| 6,723,617 | B1 | * | 4/2004 | Choi ........................... | 438/424 |
| 6,734,082 | B2 | * | 5/2004 | Zheng et al. ............... | 438/435 |
| 2002/0151143 | A1 | * | 10/2002 | Shiozawa et al. .......... | 438/296 |
| 2003/0027404 | A1 | * | 2/2003 | Lai et al. .................... | 438/424 |

* cited by examiner

*Primary Examiner*—Mary Wilczewski
*Assistant Examiner*—Toniae M. Thomas
(74) *Attorney, Agent, or Firm*—Hanley, Flight & Zimmerman, LLC

(57) ABSTRACT

Methods of manufacturing semiconductor devices are disclosed. In a disclosed example, a multi-layered insulating structure is deposited on a semiconductor substrate, an opening is formed in the multi-layered insulating structure above the semiconductor substrate, and a trench is formed in the semiconductor substrate under the opening. Then, a groove is formed on an edge position of an intermediate layer of the multi-layered insulating structure by wet-etching the intermediate layer of the multi-layered insulating layer transversely using a pull back process. Then, a liner oxide layer is deposited on the groove and the trench. An oxide layer then fills the trench and the groove without generating voids or divots in the oxide layer of the trench.

5 Claims, 4 Drawing Sheets

METHODS OF MANUFACTURING SEMICONDUCTOR DEVICES

FIELD OF THE DISCLOSURE

The present disclosure relates generally to semiconductor devices, and, more particularly to methods of manufacturing a semiconductor device which improves an electrical characteristic of the semiconductor devices by preventing generation of voids and divots in an oxide layer of a trench.

BACKGROUND

The Local Oxidation Of Silicon (LOCOS) process using a nitride layer has been used as an isolation technology for manufacturing semiconductor devices. However, the LOCOS process has a drawback in that it causes a phenomenon wherein a silicon oxide layer in the general shape of a bird's beak makes inroads into an active region. In order to complete the LOCOS process, new isolation technologies have been developed. Among these new technologies, a Poly Buffer LOCOS (PBL), a Recessed LOCOS (R-LOCOS) and other processes have been widely used. However, these technologies also have drawbacks in that these processes are complicated and they do not prevent the bird's beak phenomenon. Thus, the bird's beak phenomenon limits high-integration of semiconductor devices. Furthermore, since a considerable step between the surfaces of the oxide layer on the active region and a field region of the silicon substrate is generated, a planarizing process should be successively performed to reduce the step between the surfaces of the regions.

Recently, an improved Shallow Trench Isolation (STI) process has been introduced. The STI process has advantages in that it achieves an excellent isolation property and a small occupying area so that, when compared with conventional isolation technology, using the STI process is very advantageous in promoting high-integration of semiconductor devices.

The STI process is performed by forming a trench on a field region of a semiconductor substrate, filling the trench with a gap-filling oxide layer, and performing a Chemical Mechanical Polishing (CMP) of the oxide layer so as to planarize the oxide layer. Accordingly, a field oxide layer is formed in the trench of the field region of the semiconductor substrate.

The oxide layer that fills the trench generally includes an $O_3$-Tetra-Ethyl-Ortho—Silicate (TEOS) Atmospheric Pressure Chemical Vapor Deposition (APCVD) oxide layer and a High Density Plasma Chemical Vapor Deposition (HDP CVD) oxide layer, which have excellent filling and planarizing properties.

However, when the prior art STI process has been completed, divots have frequently been generated in the oxide layer near an upper corner portion of the trench. Furthermore, since the upper corner portion generally has an angular shape, a gate oxide layer is grown thinner on an edge portion of the active region adjacent to the upper corner portion than on the other portions of the active region. Thus, an electric field is concentrated at the edge portion of the active region, so that degradation of an electrical characteristic and increased leakage current is caused.

Recently, in consideration of this problem, a method of preventing the concentration of the electric field at the edge portion of the active region has been proposed. This proposed method seeks to prevent the noted electric field concentration by making the upper edge portion of the trench round. To this end, a pull back process is employed to wet-etch a nitride layer, (an intermediate layer of an etching mask for forming the trench), transversely.

The conventional STI process using this pull back process is conducted as shown in FIG. 1. First, an oxide layer 11, a nitride layer 13 and an oxide layer 15 are successively deposited on a semiconductor substrate 10 such as a single crystal silicon substrate. Then, using photolithography, an opening 16 is formed in the oxide layer 11, the nitride layer 13 and the oxide layer 15 above the field region of the semiconductor substrate 10. Then, using the oxide layer 15 as an etching mask, the field region of the semiconductor substrate 10 is etched to a depth of 3000 to 4000 Å, so that a trench 17 is formed in the field region of the semiconductor substrate 10.

As shown in FIG. 2, using the pull back process, the nitride layer 13 is etched a distance D of 200 to 300 Å from the opening 16 by a phosphate solution, so that a groove 18 is formed on the edge portion of the nitride layer 13 between the two oxide layers 11 and 15. By filling the groove 18 with an oxide layer 19, it is possible to prevent generation of divots in the oxide layer 19 during a subsequent procedure of wet-etching the oxide layer.

As shown in FIG. 3, using a conventional low pressure CVD process, $O_3$-TEOS CVD process, or HDP CVD process, the oxide layer 19 is deposited on the surfaces of the insulating layer 15, the trench 17 and the groove 18 in a thickness required for gap-filling the trench 17, (for example, 5000 to 6000 Å).

Although not shown in the drawings, using a conventional CMP process, the oxide layer 19 is planarized and the oxide layer 15, the nitride layer 13 and the oxide layer 11 are etched to expose the surface of the active region of the semiconductor substrate 10, thus, completing the STI process.

However, in the prior art method, when the trench 17 is filled with the oxide layer 19, the oxide layer 19 is likely to not completely fill the groove 18 due to the aspect ratio of the groove. As a result, voids may possibly be generated in the oxide layer 19 in the groove 18. As a result, divots may be generated in the oxide layer 19 in the trench 17, thereby increasing the leakage current of the semiconductor device and deteriorating an electric characteristic thereof.

BRIEF DESCRIPTION OF THE DRAWINGS

In the following description and drawings, the same reference numerals are used to designate the same or similar components, and so repetition of the description of the same or similar components will be omitted.

DETAILED DESCRIPTION

The entire disclosure of Korean Patent Application No. 10-2002-0085921 filed on Dec. 28, 2002 is incorporated herein by reference in its entirety.

Figure 1:
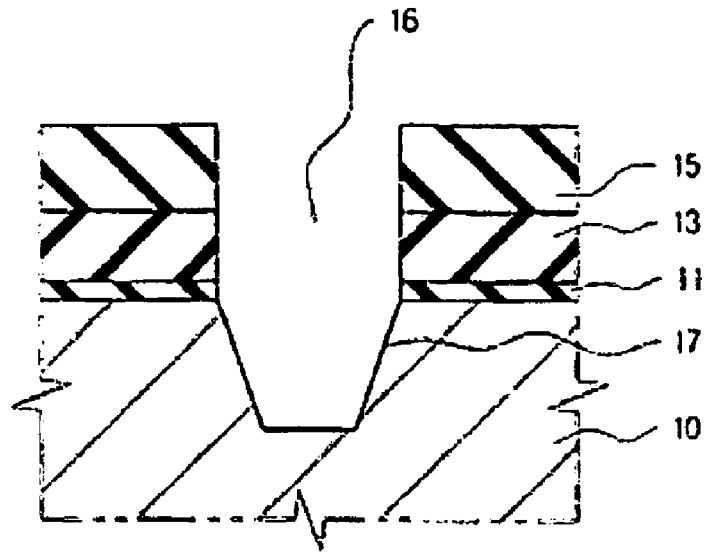
FIGS. 1 to 3 illustrate a prior art shallow trench isolation (STI) process.
Figure 2:
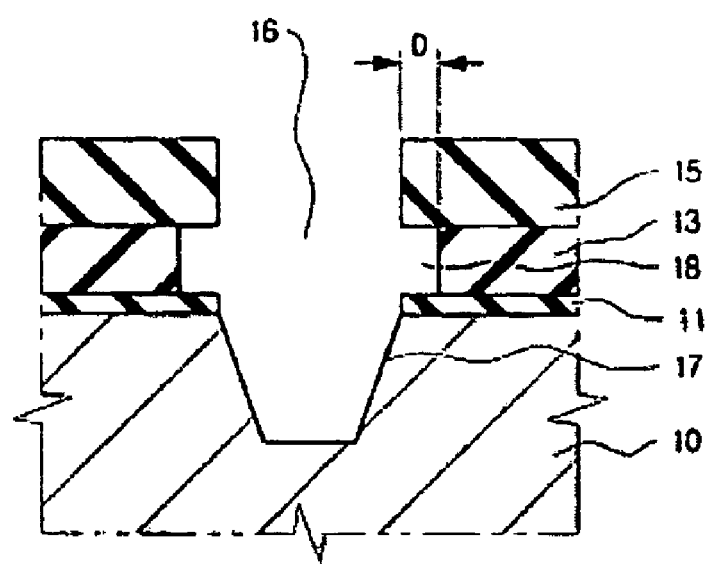
Figure 3:
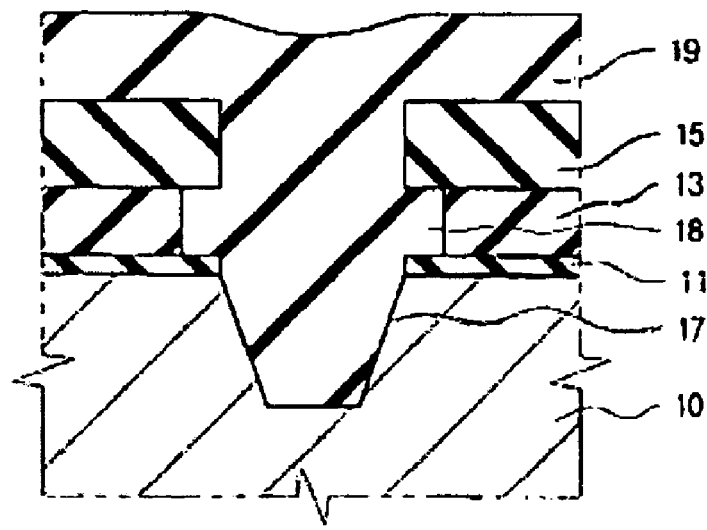
Figure 4:
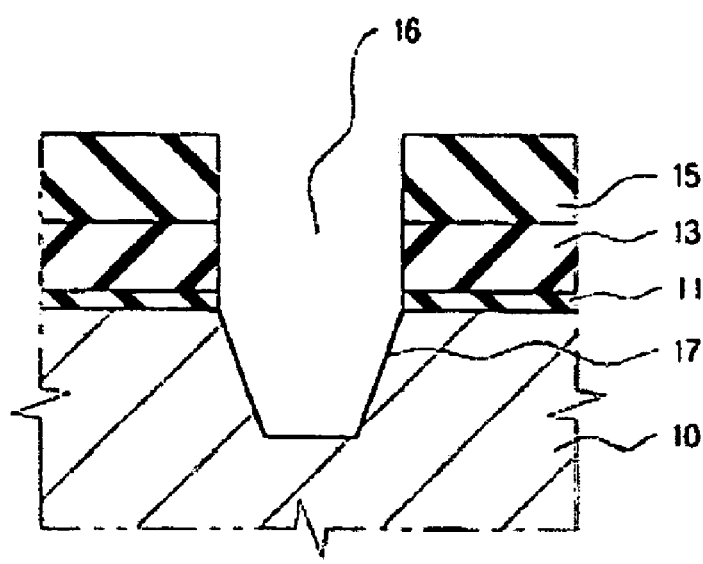
FIGS. 4 to 7 illustrate an example shallow trench isolation (STI) process performed in accordance with the teachings of the present disclosure.

Referring to FIG. 4, a multi-layered insulating structure including a lower oxide layer 11, an intermediate nitride layer 13 and an upper oxide layer 15 is deposited on one side of a semiconductor substrate 10 (e.g., a single crystal silicon substrate). In the illustrated example, the thickness of the lower oxide layer 11 is about 25 to 200 Å and the thickness of the intermediate nitride layer 13 is about 1000 to 2000 Å. A TEOS oxide layer may be used as the upper oxide layer 15. Then, using a photolithography, an opening 16 is formed in the lower oxide layer 11, the intermediate nitride layer 13 and the upper oxide layer 15 above the field region of the semiconductor substrate 10. Then, using the upper oxide layer 15 as an etching mask, the field region of the semiconductor substrate 10 is etched in a depth of, for example, 3000 to 4000 Å. A trench 17 is thereby formed in the field region of the semiconductor substrate 10.

Figure 5:
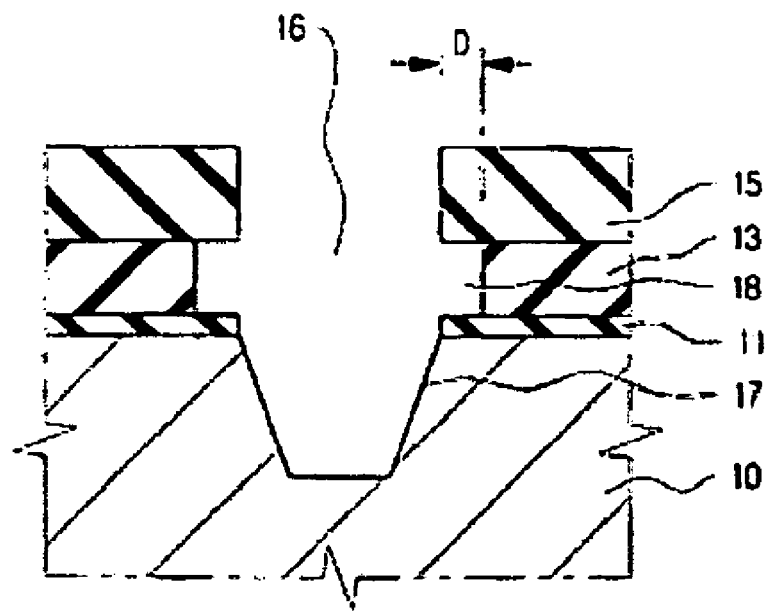
Figure 7:
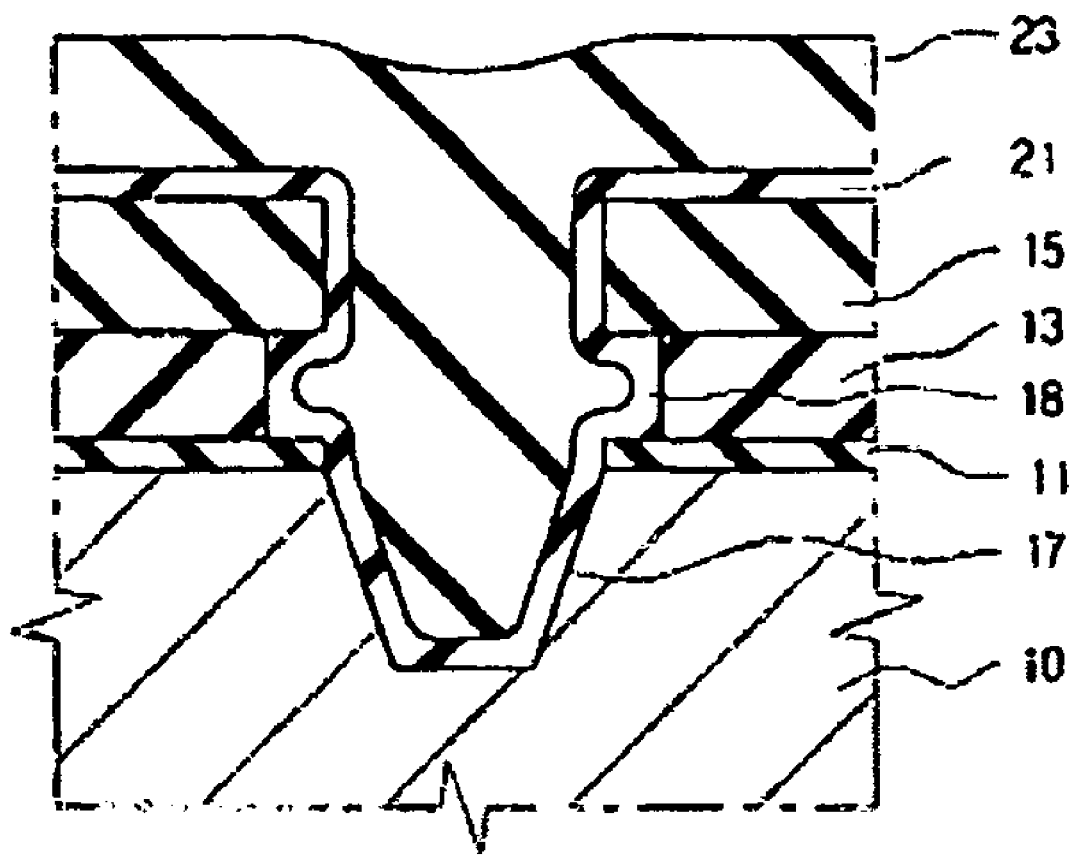

Referring to FIG. 5, a groove 18 is formed on the edge portion of the intermediate nitride layer 13 between the two oxide layers 11 and 15. This groove 18 may be formed, for example, by using a pull back process to etch the intermediate nitride layer 13 a distance D of about 200 to 300 Å from the opening 16. A phosphate solution may be used for this process. By filling the groove 18 with a gap-filling oxide layer 23 as shown in FIG. 7, it is possible to prevent generation of divots in the oxide layer 23 filling the trench 17 during a subsequent procedure of wet-etching the oxide layer 23.

Figure 6:
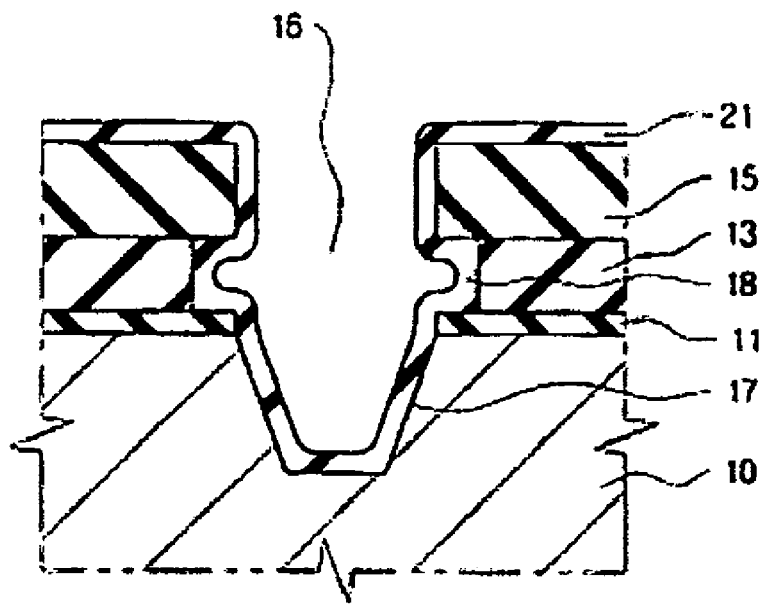

Referring to FIG. 6, a liner insulating layer 21, (for example, a liner oxide layer 21), is deposited in a thickness of, for example, about 100 to 300 Å along the surfaces of the groove 18 and the trench 17 (that is, on surfaces of the upper oxide layer 15, the trench 17 and the groove 18) using an atomic layer deposition (ALD) process). Such deposition of the liner insulating layer 21 is for preventing generation of voids in the gap-filling oxide layer 23 which would otherwise be caused by not completely filling the groove 18 with the oxide layer 23.

Taking a closer look at the deposition of the liner oxide layer 21, the semiconductor substrate 10 as shown in FIG. 5 is mounted in a vacuum container (not shown) for atomic layer deposition. $SiH_4$ gas is then introduced into the container, thereby allowing the $SiH_4$ gas to be chemically absorbed in a material of the exposed portion of the semiconductor substrate 10. Then, the introduction of $SiH_4$ gas is stopped. Purging gas (e.g., $N_2$ gas), is then introduced into the vacuum container, thus, completely discharging the remaining $SiH_4$ gas in the vacuum container. The introduction of the purging gas is stopped and $O_2$ gas is introduced into the vacuum container. This allows $O_2$ gas to be chemically absorbed again in the layer in which the $SiH_4$ gas has been previously absorbed. Accordingly, an oxide layer is deposited in an atomic layered thickness in the trench 17 and groove 18 and on the oxide layer 15. The introduction of $O_2$ gas is then stopped and purging gas, (e.g., $N_2$ gas), is introduced into the vacuum container, thus completely discharging any possibly remaining $O_2$ gas in the vacuum container. By repeating such a series of processes, the liner oxide layer 21 can be deposited in a desired thickness, (e.g., 100 to 300 Å).

Since the ALD process is performed such that the liner oxide layer 21 is deposited using a chemical reaction, the liner oxide layer 21 can be deposited at low temperature. The deposition rate of the liner oxide layer 21 varies with the deposition temperature. As a result, it is preferable to perform the deposition of the liner oxide layer 21 at a temperature of about 250 to 350° C.

Referring to FIG. 7, using a conventional low pressure CVD process, $O_3$-TEOS CVD process, or HDP CVD process, the gap-filling oxide layer 23 is deposited on the liner oxide layer 21 in a thickness required for filling the trench 17 (e.g., 5000 to 6000 Å).

As explained above, the liner oxide layer 21 is deposited on surfaces of the upper insulating layer 15, the trench 17 and the groove 18 using the ALD process. The gap-filling oxide layer 23 then fills the trench 17 to, thus, completely fill the groove 18 with the gap-filling oxide layer 23. As a result, defects such as voids are not generated in the gap-filling oxide layer 23 of the groove 18 and divots are also not generated in the gap-filling oxide layer 23 of the trench 17.

Although not shown in the drawings, the oxide layer 23 is planarized using a conventional CMP process. The oxide layer 15, the nitride layer 13 and the oxide layer 11 are etched to expose the surface of the active region of the semiconductor substrate 10, thus completing the STI process.

As a result of the process described above, the leakage current of the semiconductor device is reduced and, therefore, an electric characteristic of the device is improved.

As described above, the method of manufacturing a semiconductor device is performed by forming a multi-layered insulating structure on a semiconductor substrate 10, forming an opening 16 in the insulating layer so as to expose a field region of the semiconductor substrate 10, forming a trench 17 in the field region of the semiconductor substrate 10, forming a groove 18 on an edge portion of an intermediate layer 13 of the multi-layered insulating structure by transversely wet-etching the intermediate layer 13 using a pull back process, depositing a liner insulating layer 21 on the multi-layered insulating structure, and filling the trench 17 with a gap-filling oxide layer 23. Accordingly, it is possible to fill the groove 18 with the insulating layer 23 without generation of voids, so that it is possible to prevent generation of divots in the insulating layer 23 of the trench 17. Further, it is possible to reduce leakage current of the semiconductor device and, an electrical characteristic of the semiconductor device can thereby be improved.

From the foregoing, persons of ordinary skill in the art will appreciate that the above disclosed methods solve the above-mentioned problems occurring in the prior art by reducing the generation of divots in the oxide layer 23 of the trench 17. Further, the above disclosed methods reduce the leakage current of the semiconductor devices, thus, improving an electric characteristic of those semiconductor devices.

To these ends, a disclosed method of manufacturing a semiconductor device includes: forming a multi-layered insulating structure on a semiconductor substrate 10; forming an opening 16 in the insulating structure so as to expose a field region of the semiconductor substrate 10; forming a trench 17 in the field region of the semiconductor substrate 10; forming a groove 18 on an edge portion of an intermediate layer 13 of the multi-layered insulating structure; depositing a liner insulating layer 21 in a desired thickness along a surface of the multi-layered insulating structure including surfaces of the groove 18 and the trench 17; and filling the groove 18 and the trench 17 with a gap-filling oxide layer 23.

The groove 18 is filled with the oxide layer 23 without generating voids, thus preventing the generation of divots in the oxide layer 23 of the trench 17.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a semiconductor device comprising: forming a multi-layered insulating structure on a semiconductor substrate, the multi-layered insulating structure including an upper oxide layer, an intermediate nitride layer and a lower oxide layer; forming an opening in the insulating structure to expose a field region of the semiconductor substrate; forming a trench in the field region of the semiconductor substrate; forming a groove on an edge portion of the intermediate nitride layer of the multi-layered insulating structure; depositing a liner insulating layer in a desired thickness on surfaces of the trench, on an edge of the lower oxide layer, in the groove of the edge portion of the intermediate nitride layer, and on an edge of the upper oxide layer; and filling the groove and the trench with an oxide layer.

2. A method as defined in claim 1, wherein the liner insulating layer comprises a liner oxide layer.

3. A method as defined in claim 2, wherein the liner oxide layer is deposited by an atomic layer deposition (ALD) process.

4. A method as defined in claim 3, wherein the liner oxide layer is deposited in a thickness of approximately 100 to 300 Å.

5. A method as defined in claim 4, wherein the liner oxide layer is deposited at a temperature of approximately 250 to 350° C.

* * * * *